(12) United States Patent
Shin et al.

(10) Patent No.: US 7,361,563 B2
(45) Date of Patent: Apr. 22, 2008

(54) METHODS OF FABRICATING A SEMICONDUCTOR DEVICE USING A SELECTIVE EPITAXIAL GROWTH TECHNIQUE

(75) Inventors: Dong-Suk Shin, Yongin-si (KR); Hwa-Sung Rhee, Seongnam-si (KR); Tetsuji Ueno, Suwon-si (KR); Ho Lee, Gyeonggi-do (KR); Seung-Hwan Lee, Seoul (KR)

(73) Assignee: Samsung Electronics Co., Ltd. (KR)

( * ) Notice: Subject to any disclaimer, the term of this patent is extended or adjusted under 35 U.S.C. 154(b) by 290 days.

(21) Appl. No.: 11/299,447

(22) Filed: Dec. 9, 2005

(65) Prior Publication Data

US 2006/0088968 A1    Apr. 27, 2006

Related U.S. Application Data

(63) Continuation-in-part of application No. 11/154,236, filed on Jun. 16, 2005.

(30) Foreign Application Priority Data

Jun. 17, 2004  (KR) ............... 10-2004-0045157
Feb. 3, 2005   (KR) ............... 10-2005-0010272

(51) Int. Cl.
  *H01L 21/205*   (2006.01)
  *H01L 29/80*    (2006.01)
  *H01L 21/336*   (2006.01)

(52) U.S. Cl. ............... 438/300; 438/492; 438/507

(58) Field of Classification Search ........... 438/492, 438/507, 300
See application file for complete search history.

(56) References Cited

U.S. PATENT DOCUMENTS

| | | | | |
|---|---|---|---|---|
| 4,549,926 A | * | 10/1985 | Corboy et al. | 438/412 |
| 4,578,142 A | * | 3/1986 | Corboy et al. | 117/89 |
| 4,592,792 A | * | 6/1986 | Corboy et al. | 438/507 |
| 4,698,316 A | * | 10/1987 | Corboy et al. | 117/102 |
| 4,838,993 A | * | 6/1989 | Aoki et al. | 438/299 |
| 6,190,453 B1 | * | 2/2001 | Boydston et al. | 117/89 |
| 6,290,774 B1 | * | 9/2001 | Solomon et al. | 117/89 |
| 6,391,749 B1 | | 5/2002 | Park et al. | 438/478 |
| 6,429,084 B1 | | 8/2002 | Park et al. | 438/305 |
| 6,605,498 B1 | | 8/2003 | Murthy et al. | 438/197 |
| 6,852,600 B1 | * | 2/2005 | Wang et al. | 438/301 |
| 6,998,305 B2 | * | 2/2006 | Arena et al. | 438/216 |
| 2002/0034864 A1 | | 3/2002 | Mizushima et al. | 438/486 |
| 2002/0192930 A1 | | 12/2002 | Rhee et al. | 438/504 |

(Continued)

FOREIGN PATENT DOCUMENTS

| | | | |
|---|---|---|---|
| JP | 61-265814 | * | 11/1986 |
| JP | 3-50191 | * | 3/1991 |
| JP | 3-50771 | * | 3/1991 |
| KR | 10-2001-0036270 | | 5/2001 |
| KR | 10-2002-0013197 | | 2/2002 |
| KR | 10-2002-0028488 | | 4/2002 |

*Primary Examiner*—M. Wilczewski
(74) *Attorney, Agent, or Firm*—Mills & Onello LLP

(57) ABSTRACT

Methods of fabricating a semiconductor device using a selective epitaxial growth technique include forming a recess in a semiconductor substrate. The substrate having the recess is loaded into a reaction chamber. A semiconductor source gas and a main etching gas are injected into the reaction chamber to selectively grow an epitaxial semiconductor layer on a sidewall and on a bottom surface of the recess. A selective etching gas is injected into the reaction chamber to selectively etch a fence of the epitaxial semiconductor layer which is adjacent to the sidewall of the recess and grown to a level that is higher than an upper surface of the semiconductor substrate.

26 Claims, 7 Drawing Sheets

U.S. PATENT DOCUMENTS

| | | | |
|---|---|---|---|
| 2004/0045499 A1* | 3/2004 | Langdo et al. | 117/84 |
| 2004/0129982 A1* | 7/2004 | Oda et al. | 257/369 |
| 2004/0171238 A1* | 9/2004 | Arena et al. | 438/507 |
| 2005/0176204 A1* | 8/2005 | Langdo et al. | 438/298 |
| 2005/0279997 A1* | 12/2005 | Shin et al. | 257/49 |
| 2006/0073679 A1* | 4/2006 | Airaksinen et al. | 438/478 |
| 2006/0088968 A1* | 4/2006 | Shin et al. | 438/299 |
| 2006/0131656 A1* | 6/2006 | Shin et al. | 257/369 |
| 2006/0156970 A1* | 7/2006 | Dong-Suk et al. | 117/97 |
| 2006/0202278 A1* | 9/2006 | Shima et al. | 257/369 |
| 2006/0234488 A1* | 10/2006 | Kim et al. | 438/607 |
| 2006/0258125 A1* | 11/2006 | Langdo et al. | 438/481 |
| 2007/0048907 A1* | 3/2007 | Lee et al. | 438/142 |
| 2007/0131159 A1* | 6/2007 | Kim et al. | 117/58 |
| 2007/0134879 A1* | 6/2007 | Kim et al. | 438/300 |
| 2007/0148835 A1* | 6/2007 | Shima et al. | 438/153 |
| 2007/0148919 A1* | 6/2007 | Lin et al. | 438/478 |
| 2007/0202669 A1* | 8/2007 | Fukuda et al. | 438/507 |

* cited by examiner

METHODS OF FABRICATING A SEMICONDUCTOR DEVICE USING A SELECTIVE EPITAXIAL GROWTH TECHNIQUE

CROSS-REFERENCE TO RELATED APPLICATION

The present application is a continuation-in-part of U.S. patent application Ser. No. 11/154,236, filed Jun. 16, 2005, which claims priority from Korean Patent Application No. 10-2004-0045157, filed Jun. 17, 2004. The present application further claims priority from Korean Patent Application No. 10-2005-0010272, filed Feb. 3, 2005. The disclosures of all of the above applications are incorporated herein by reference in their entirety.

BACKGROUND OF THE INVENTION

1. Field of the Invention

The present invention relates to semiconductor processes and semiconductor devices fabricated using the same and, more particularly, to methods of selectively forming an epitaxial semiconductor layer on a single crystalline semiconductor and semiconductor devices fabricated using the same.

2. Description of the Related Art

Metal oxide semiconductor (MOS) transistors are widely employed in semiconductor devices. As semiconductor devices become more highly integrated, MOS transistors have become scaled down is size. In particular, in order to implement high-performance semiconductor devices, channel lengths of the MOS transistors have become reduced. However, as the channel length is reduced, the short channel effect becomes more and more of a problem in MOS transistors. Accordingly, in order to mitigate the effects of the short channel effect, junction depths of source and drain regions of the MOS transistors should also be reduced. In other words, in order to fabricate high performance MOS transistors, methods of forming shallow source and drain regions are required. However, such shallow source and drain regions may lead to an increase of on-resistance of the MOS transistors, and increase of the on-resistance may in turn degrade current drivability of the MOS transistors.

In recent years, elevated source/drain structures have been proposed to improve current drivability and the short channel effect of the MOS transistors. In order to fabricate the elevated source/drain structure, a selective epitaxial growth technique has been widely used.

The selective epitaxial growth technique is disclosed in U.S. Pat. No. 6,429,084 B1 to Park et al., entitled "MOS transistors with raised sources and drains". According to Park et al, a gate capping insulating layer is formed on a gate electrode. The gate capping insulating layer prevents an epitaxial semiconductor layer from being formed on the gate electrode while the epitaxial semiconductor layer is formed on the source and drain regions. As a result, a complicated process is required in order to form a metal silicide layer on the gate electrode in a subsequent process.

Furthermore, a method of forming the elevated source and drain regions is disclosed in US Patent Publication No. 2002/0034864 A1 to Mizushima et al., entitled "Semiconductor device and method of fabricating the same". According to Mizushima et al, an amorphous silicon layer is formed on an entire surface of a semiconductor substrate having a polysilicon gate electrode and single crystalline source/drain regions using a blanket deposition technique. The amorphous silicon layer is crystallized using a solid phase epitaxial (SPE) technique. As a result, elevated single crystalline source/drain regions are formed only on the single crystalline source/drain regions, and the amorphous silicon layer (or a polycrystalline silicon layer) still remains on the polysilicon gate electrode.

The amorphous silicon layer or the polycrystalline silicon layer formed on the gate electrode is selectively removed using a HCl gas. The single crystalline silicon layer on the source/drain regions is formed using a single step of the SPE process. In this case, when the SPE process time is increased to the increase in the thickness of the single crystalline silicon layer on the source/drain regions, the single crystalline silicon layer on the source/drain regions grows in a lateral direction. Accordingly, the single crystalline silicon layer may also be formed on an isolation layer adjacent the source/drain regions. Therefore, when the width of the isolation layer is reduced in order to realize highly integrated semiconductor devices, an electrical shortage may occur between adjacent source/drain regions.

In addition, methods of fabricating a MOS transistor having a strained channel using the selective epitaxial growth technique are disclosed in U.S. Pat. No. 6,605,498 to Murthy et al., entitled "Semiconductor Transistor Having a Backfilled Channel Material". According to Murthy et al., a semiconductor substrate at both sides of a channel region is etched to form recesses, and the recesses are filled with a semiconductor material having a lattice constant that is different from that of the channel region using the selective epitaxial growth technique. Consequently, tensile stress or compressive stress may be applied to the channel region, thereby changing the mobility of carriers in the channel region. In this case, an epitaxial layer on sidewalls of the recesses may be excessively grown to cover a sidewall of a gate pattern on the channel region. As a result, the epitaxial layer formed in the recesses may have an uneven surface profile.

SUMMARY OF THE INVENTION

The present invention is directed to semiconductor processes and devices in which an epitaxial layer is selectively formed on a single crystalline semiconductor in a manner which addresses the limitations incurred in the prior-art approaches discussed above.

In one aspect, the present invention is directed to a method of fabricating a semiconductor device. A non-single crystalline semiconductor pattern is formed on a single crystalline semiconductor substrate. An insulating spacer is formed on side walls of the non-single crystalline semiconductor pattern. The substrate with the insulating spacer is loaded into a reaction chamber. A main semiconductor source gas and a main etching gas are injected into the reaction chamber to selectively grow a single crystalline epitaxial semiconductor layer and a non-single crystalline epitaxial semiconductor layer on the single crystalline semiconductor substrate and the non-single crystalline semiconductor pattern, respectively. A selective etching gas is injected into the reaction chamber to selectively remove the non-single crystalline epitaxial semiconductor layer on the non-single crystalline semiconductor pattern. The main gases and the selective etching gas are alternately and repeatedly injected at least two times to selectively form an elevated single crystalline semiconductor layer having a desired thickness only on the single crystalline semiconductor substrate.

In some embodiments, the single crystalline semiconductor substrate may be a single crystalline silicon substrate, a single crystalline germanium substrate, a single crystalline silicon germanium substrate, a single crystalline silicon carbide substrate or a semiconductor on insulator (SOI) substrate having one layer thereof.

In other embodiments, the non-single crystalline semiconductor pattern may be formed of an amorphous semiconductor layer or a polycrystalline semiconductor layer. The amorphous semiconductor layer or the polycrystalline semiconductor layer may be a silicon layer, a germanium layer, a silicon germanium layer or a silicon carbide layer.

In yet other embodiments, impurity ions may be implanted into the single crystalline semiconductor substrate using the non-single crystalline semiconductor pattern and the insulating spacer as ion implantation masks before the substrate is loaded into the reaction chamber. The substrate having the impurity ions is annealed to form an activated single crystalline impurity region.

In still other embodiments, a surface of the substrate having the insulating spacer may be cleaned before the substrate is loaded into the reaction chamber.

In yet still other embodiments, an in-situ cleaning gas may be injected into the reaction chamber prior to injection of the main semiconductor source gas and the main etching gas. The in-situ cleaning gas may be a hydrogen gas.

In further embodiments, an initial semiconductor source gas and an initial etching gas may be injected into the reaction chamber prior to injection of the main semiconductor source gas and the main etching gas, thereby selectively forming an initial single crystalline epitaxial semiconductor layer and an initial non-single crystalline epitaxial semiconductor layer on the single crystalline semiconductor substrate and the non-single crystalline semiconductor pattern respectively. The selective etching gas may remove the non-single crystalline epitaxial semiconductor layer and etch the initial non-single crystalline epitaxial semiconductor layer. The initial semiconductor source gas and the initial etching gas may be injected with a dopant gas. The initial semiconductor source gas may be the same as the main semiconductor source gas, and the initial etching gas may be the same as the main etching gas.

In yet further embodiments, the main semiconductor source gas may be one of a silicon source gas, a germanium source gas, a silicon germanium source gas and a silicon carbide source gas. The silicon source gas may be one of a silane ($SiH_4$) gas, a disilane ($Si_2H_6$) gas, a dichlorosilane ($SiH_2Cl_2$) gas, a $SiHCl_3$ gas and a $SiCl_4$ gas, and the germanium source gas may be a $GeH_4$ gas. The silicon germanium source gas may comprise the silicon source gas and the germanium source gas. In addition, the silicon carbide source gas may comprise the silicon source gas and a carbon source gas. The carbon source gas may be a $C_2H_6$ gas or a $CH_3SiH_3$ gas.

In still further embodiments, the main etching gas and the selective etching gas may contain halogen elements which react with atoms of the epitaxial semiconductor layer. The main etching gas and the selective etching gas containing the halogen elements may be a HCl gas, a $Cl_2$ gas or a diluted HCl gas. The diluted HCl gas may be a mixture of a HCl gas and a hydrogen gas.

In yet still further embodiments, the main semiconductor source gas and the main etching gas may be injected with a dopant gas.

In some further embodiments, a first purge gas may be injected into the reaction chamber prior to injection of the selective etching gas, and a second purge gas may be injected into the reaction chamber after injection of the selective etching gas. The first and second purge gases may be a hydrogen gas.

In another aspect of the present invention, the invention is directed to methods of fabricating a metal oxide semiconductor (MOS) transistor having elevated source/drain regions using a selective epitaxial growth technique. The methods include forming an isolation layer in a predetermined region of a single crystalline semiconductor substrate to define an active region. An insulated gate electrode is formed on the active region. The gate electrode is formed of a non-single crystalline semiconductor layer. An insulating gate spacer is formed on sidewalls of the non-single crystalline gate electrode. The substrate having the gate spacer is loaded into a reaction chamber. A main semiconductor source gas and a main etching gas are injected into the reaction chamber to selectively form a non-single crystalline epitaxial semiconductor layer and a single crystalline epitaxial semiconductor layer on the gate electrode and the active region respectively. A selective etching gas is injected into the reaction chamber to selectively remove the non-single crystalline epitaxial semiconductor layer on the non-single crystalline gate electrode. The main gases and the selective etching gas are alternately and repeatedly injected at least two times to selectively form elevated single crystalline source/drain regions having a desired thickness only on the active regions adjacent to the gate electrode.

In yet other aspects of the present invention, the invention is directed to semiconductor devices and MOS transistors fabricated by the above-mentioned methods.

Yet other aspects of the invention provide methods of fabricating a MOS transistor having a strained channel.

In one aspect, the present invention is directed to a method of fabricating a semiconductor device, comprising: forming a recess in a semiconductor substrate; loading the substrate having the recess into a reaction chamber; injecting a semiconductor source gas and a main etching gas into the reaction chamber to selectively grow an epitaxial semiconductor layer on a sidewall and on a bottom surface of the recess; and injecting a selective etching gas into the reaction chamber to selectively etch a fence of the epitaxial semiconductor layer adjacent to the sidewall of the recess and grown to a level that is higher than an upper surface of the semiconductor substrate.

In one embodiment, the method further comprises alternately and repeatedly performing the injection of the semiconductor source gas and the main etching gas and the injection of the selective etching gas at least once, thereby forming a final epitaxial semiconductor layer that fills the recess and has a substantially flat top surface.

In another embodiment, the semiconductor substrate is a single crystalline silicon substrate, a single crystalline germanium substrate, a single crystalline silicon germanium substrate, a single crystalline silicon carbide substrate, or a silicon-on-insulator (SOI) substrate having any one layer thereof.

In another embodiment, forming the recess includes selectively anisotropically etching a predetermined region of the semiconductor substrate.

In another embodiment, the semiconductor source gas is a silicon source gas, a germanium source gas, a silicon germanium source gas, or a silicon carbide source gas.

In another embodiment, the main etching gas and the selective etching gas are gases containing halogen elements reacting with atoms of the epitaxial semiconductor layer.

In another embodiment, each of the main etching gas and the selective etching gas is a hydrogen chloride (HCl) gas, a chlorine (Cl$_2$) gas or a sulfur hexafluoride (SF$_6$) gas. In another embodiment, each of the main etching gas and the selective etching gas further contains at least one of a hydrogen (H$_2$) gas, an argon (Ar) gas, a nitrogen (N$_2$) gas, an oxygen (O$_2$) gas or a helium (He) gas.

In another embodiment, the method further comprises: injecting a first purge gas into the reaction chamber prior to injection of the selective etching gas; and injecting a second purge gas into the reaction chamber after injection of the selective etching gas. In another embodiment, the first and second purge gases are hydrogen gases.

In another embodiment, the epitaxial semiconductor layer is formed of a semiconductor material having a lattice constant that is different than a lattice constant of the semiconductor substrate.

In another aspect, the present invention is directed to a method of fabricating a metal oxide semiconductor (MOS) transistor, comprising: forming a gate pattern on a semiconductor substrate; forming an insulating spacer on sidewalls of the gate pattern; forming recesses in the semiconductor substrate at both sides of the gate pattern; loading the substrate having the recesses into a reaction chamber; injecting a semiconductor source gas and a main etching gas into the reaction chamber to selectively grow epitaxial semiconductor layers on sidewalls and on bottom surfaces of the recesses; and injecting a selective etching gas into the reaction chamber to selectively etch fences of the epitaxial semiconductor layer adjacent to the sidewalls of the recesses and grown to a level that is higher than an upper surface of the semiconductor substrate.

In one embodiment, the method further comprises: alternately and repeatedly performing the injection of the semiconductor source gas and the main etching gas and the injection of the selective etching gas at least once to form final epitaxial semiconductor layers that fill the recesses and have substantially flat top surfaces.

In another embodiment, the final epitaxial semiconductor layers are formed to fill the recesses and have top surfaces that are higher than the upper surface of the semiconductor substrate.

In another embodiment, the method further comprises: after formation of the final epitaxial semiconductor layers, implanting impurity ions into the final epitaxial semiconductor layers using the gate pattern and the insulating spacer as ion implantation masks to form source/drain regions.

In another embodiment, the fences of the epitaxial semiconductor layers are grown to cover a lower side portion of the insulating spacer.

In another embodiment, the semiconductor substrate is a single crystalline silicon substrate, a single crystalline germanium substrate, a single crystalline silicon germanium substrate, a single crystalline silicon carbide substrate, or a silicon-on-insulator (SOI) substrate having any one layer thereof.

In another embodiment, forming the recesses includes anisotropically etching the semiconductor substrate using the gate pattern and the insulating spacers as etch masks.

In another embodiment, the semiconductor source gas is a silicon source gas, a germanium source gas, a silicon germanium source gas, or a silicon carbide source gas.

In another embodiment, the main etching gas and the selective etching gas are gases containing halogen elements reacting with atoms of the epitaxial semiconductor layer. In another embodiment, each of the main etching gas and the selective etching gas is a hydrogen chloride (HCl) gas, a chlorine (Cl$_2$) gas or a sulfur hexafluoride (SF$_6$) gas. In another embodiment, each of the main etching gas and the selective etching gas further contains at least one of a hydrogen (H$_2$) gas, an argon (Ar) gas, a nitrogen (N$_2$) gas, an oxygen (O$_2$) gas or a helium (He) gas.

In another embodiment, the semiconductor source gas and the main etching gas are injected along with a dopant gas.

In another embodiment, the method further comprises: injecting a first purge gas into the reaction chamber prior to injection of the selective etching gas; and injecting a second purge gas into the reaction chamber after injection of the selective etching gas.

In another embodiment, the first and second purge gases are hydrogen gases.

In another embodiment, the epitaxial semiconductor layer is formed of a semiconductor material having a lattice constant different than that of a lattice constant of the semiconductor substrate.

BRIEF DESCRIPTION OF THE DRAWINGS

The foregoing and other objects, features and advantages of the invention will be apparent from the more particular description of preferred embodiments of the invention, as illustrated in the accompanying drawings. The drawings are not necessarily to scale, emphasis instead being placed upon illustrating the principles of the invention.

DETAILED DESCRIPTION OF EMBODIMENTS OF THE INVENTION

Figure 1A:
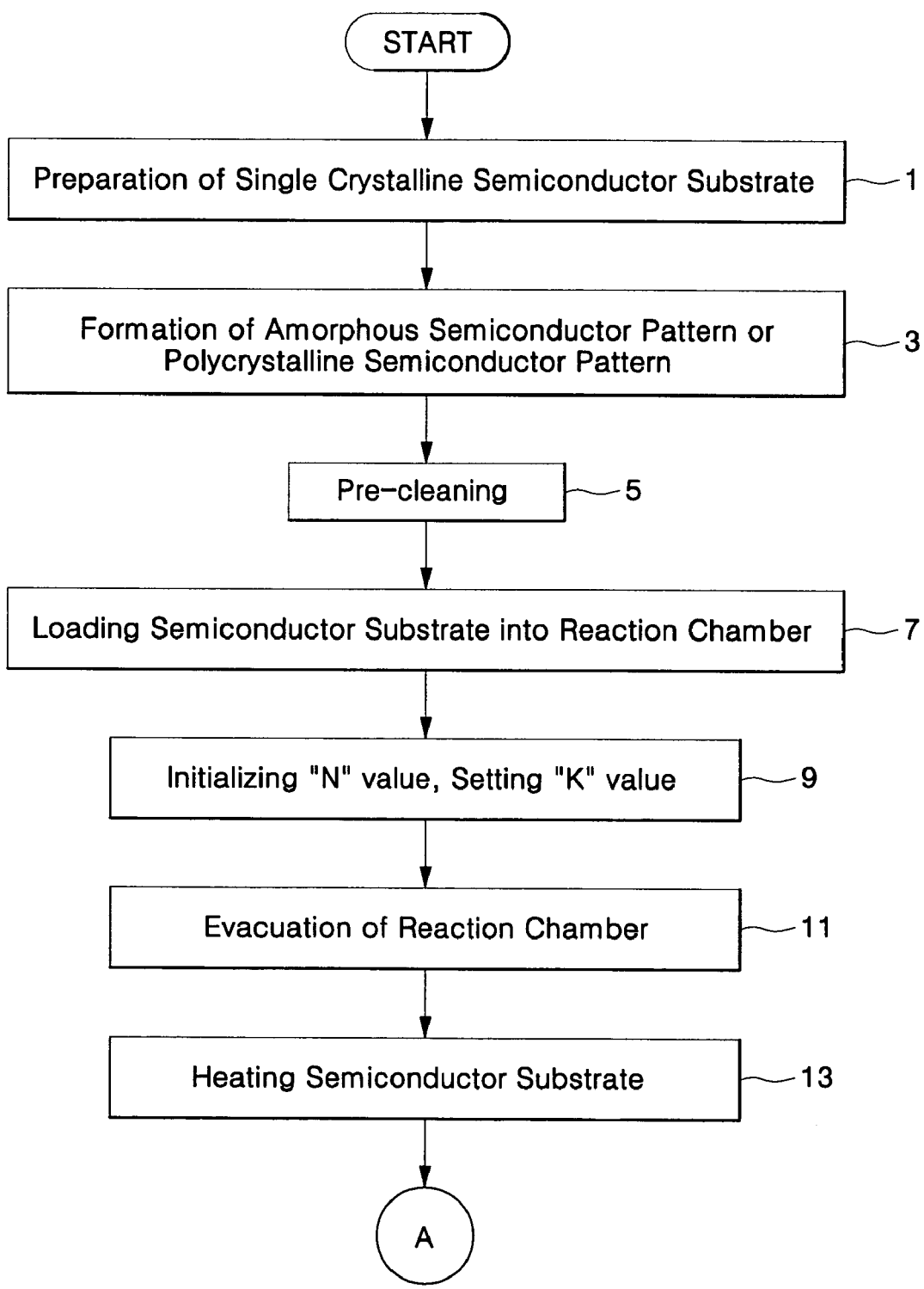
FIGS. 1A and 1B are process flow charts illustrating methods of forming a selective epitaxial semiconductor layer in accordance with embodiments of the present invention.

The present invention will now be described more fully hereinafter with reference to the accompanying drawings, in which preferred embodiments of the invention are shown. This invention may, however, be embodied in different forms and should not be construed as limited to the embodiments set forth herein. In the drawings, the thickness of layers and regions are exaggerated for clarity. Like numbers refer to like elements throughout the specification.

Figure 1B:
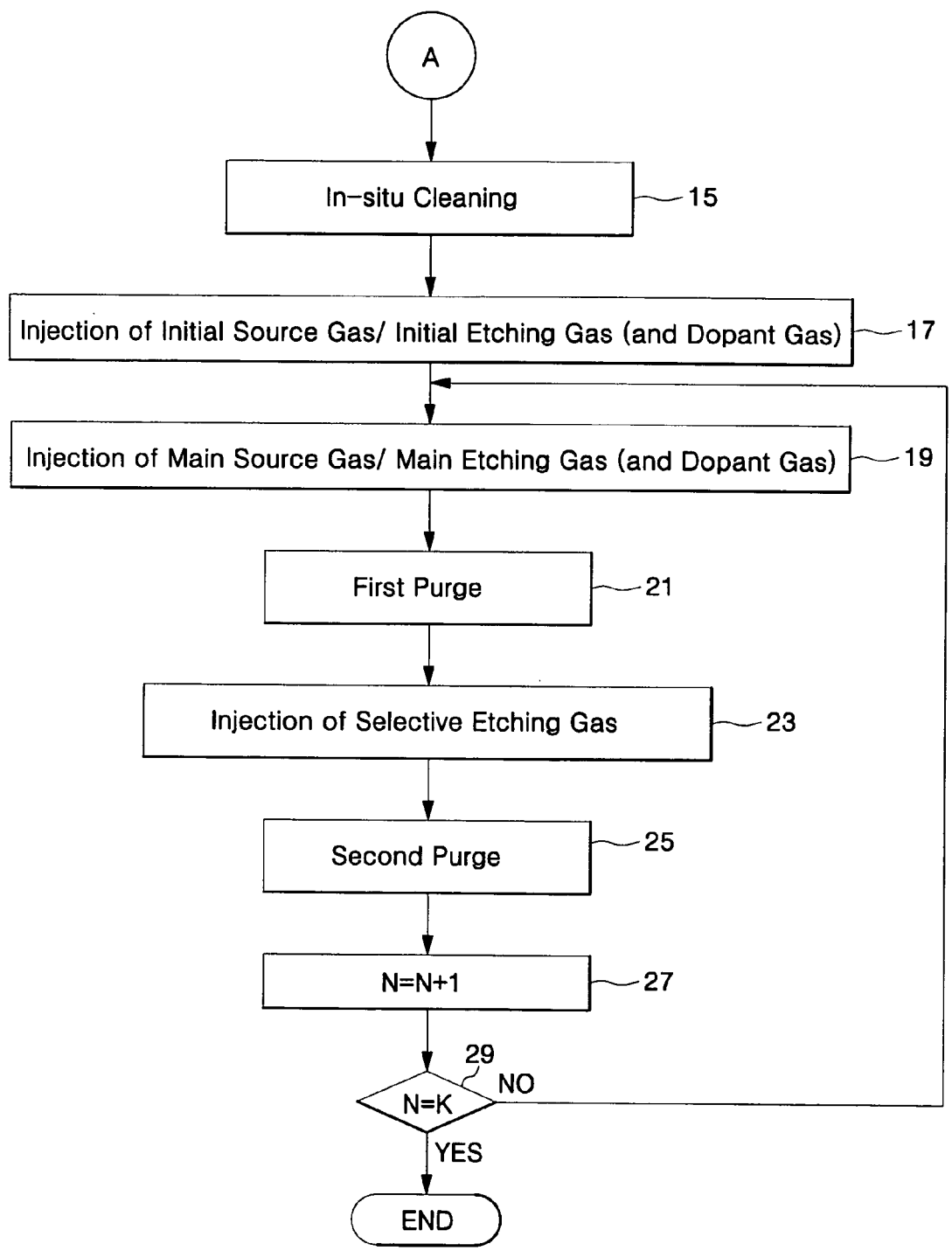

FIGS. 1A and 1B are process flow charts illustrating a selective epitaxial growth process in accordance with embodiments of the present invention, and FIGS. 2 to 5 are cross-sectional views illustrating methods of fabricating MOS transistors using the selective epitaxial growth technique in accordance with embodiment of the present invention.

Figure 2:
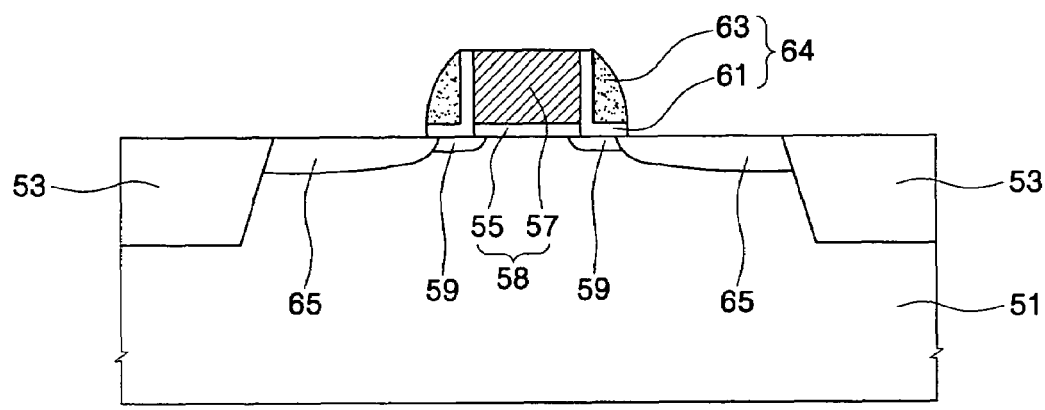
FIGS. 2 to 5 are cross-sectional views illustrating methods of fabricating MOS transistors using selective epitaxial growth technique in accordance with embodiment of the present invention.

Referring to FIGS. 1A, 1B and 2, a single crystalline semiconductor substrate 51 is prepared (step 1 of FIG. 1A). The single crystalline semiconductor substrate 51 can be, for example, a single crystalline semiconductor wafer or a semiconductor on insulator (SOI) substrate having a single crystalline semiconductor body layer. The single crystalline semiconductor body layer comprises, for example, a single crystalline silicon layer, a single crystalline germanium layer or a single crystalline SiGe layer, and the single crystalline semiconductor wafer may be a single crystalline silicon wafer, a single crystalline germanium wafer or a single crystalline SiGe layer. In the embodiments described herein, it is assumed that the single crystalline semiconductor substrate 51 is a single crystalline silicon wafer for the purpose of simplicity in description.

An isolation layer 53 is formed in a predetermined region of the semiconductor substrate 51 to define an active region. The isolation layer 53 may be formed using a typical trench isolation technique. A gate insulating layer 55 is formed on the active region, and a non-single crystalline semiconductor layer, i.e., a gate conductive layer is formed on the substrate 51 having the gate insulating layer 55. The non-single crystalline semiconductor layer can be formed, for example, of an amorphous silicon layer or a polycrystalline silicon layer. The non-single crystalline semiconductor layer is patterned to form a non-single crystalline semiconductor pattern, i.e., a non-single crystalline gate electrode 57 which spans the active region (step 3 of FIG. 1A). In this case, the gate insulating layer 55 may also be etched to expose a surface of the active region adjacent to the gate electrode 57. The gate electrode 57 and the gate insulating layer 55 under the gate electrode 57 constitute a gate pattern 58.

Impurity ions are implanted into the active region using the non-single crystalline gate electrode 57 as an ion implantation mask to form a low concentration impurity regions 59. The low concentration impurity region 59 is formed by implanting impurity ions having a different conductivity type from that of the semiconductor substrate 51. For example, when the semiconductor substrate 51 is a P type silicon substrate, the low concentration impurity regions 59 may be formed by implanting N type impurity ions. An insulating spacer layer, i.e., a gate spacer layer, is formed on an entire surface of the substrate having the low concentration impurity regions 59. The insulating spacer layer may be formed by sequentially stacking a silicon oxide layer and a silicon nitride layer. The insulating spacer layer is anisotropically etched to form an insulating spacer 64, i.e., a gate spacer on sidewalls of the gate pattern 58. As a result, the insulating spacer 64 is formed to have an inner oxide spacer 61 and an outer nitride spacer 63.

Impurity ions are implanted into the active region using the non-single crystalline gate electrode 57, the insulating spacer 64 and the isolation layer 53 as ion implantation masks to form source/drain regions 65. The source/drain regions 65 are formed by implanting impurity ions having the same conductivity type as that of the low concentration impurity regions 59. In addition, the source/drain regions 65 are formed to have an impurity concentration higher than that of the low concentration impurity region 59. As a result, lightly doped drain (LDD) type source/drain regions are formed at both sides of the gate electrode 57. A typical thermal treatment process is carried out after the ion implantation process for forming the source/drain regions 65, thereby activating the impurity ions in the source/drain regions 65. Accordingly, the activated source/drain regions 65 have the same single crystalline structure as that of the semiconductor substrate 51.

Figure 3:
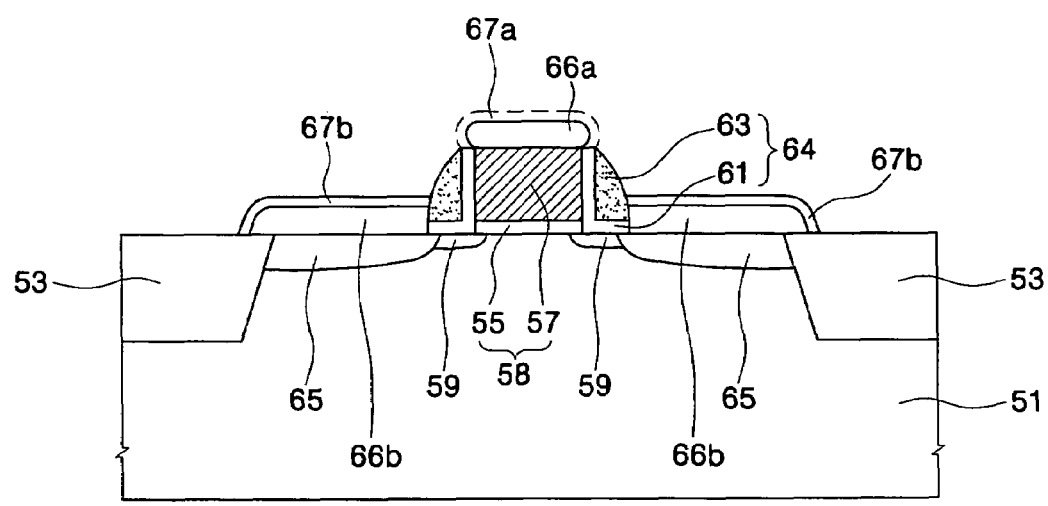

Referring to FIGS. 1A, 1B and 3, the surface of the substrate having the source/drain regions 65 is cleaned to remove a native oxide layer and contaminants on the source/drain regions 65 and the gate electrode 57 (step 5 of FIG. 1A). The cleaning may be carried out using a dry cleaning process or a wet cleaning process. The cleaned substrate is loaded into a reaction chamber of an epitaxial apparatus (step 7 of FIG. 1A). An "N" value allocated in a first register of a controller of the epitaxial apparatus is initialized to "0", where N is related to the number of process cycles that have taken place. Also, a "K" value allocated in a second register thereof is set to a desired number of process cycles (step 9 of FIG. 1A).

Subsequently, air in the reaction chamber is evacuated using a vacuum pump to control the pressure in the reaction chamber to a lower pressure than 1 atmosphere (step 11 of FIG. 1A). The semiconductor substrate in the reaction chamber is then heated to a predetermined temperature (step 13 of FIG. 1A). A surface of the heated substrate, in particular, the surface of the gate electrode 57 and the surfaces of the source/drain regions 65 are cleaned using an in-situ cleaning process (step 15 of FIG. 1B). The in-situ cleaning process is, for example, carried out by injecting a cleaning gas into the reaction chamber. A hydrogen gas may be employed as the cleaning gas, and the in-situ cleaning process may be performed at a temperature of about 700° C. to about 950° C. The hydrogen gas reduces a native oxide layer, which is generated on the surfaces of the source/drain regions 65 and the surface of the gate electrode 57. As a result, the in-situ cleaning process removes the native oxide layers on the source/drain regions 65 and the gate electrode 57.

After the in-situ cleaning process is finished, an initial semiconductor source gas and an initial etching gas are injected into the reaction chamber (step 17 of FIG. 1B). The initial semiconductor source gas and the initial etching gas are, for example, injected for about 5 seconds to about 100 seconds. The initial etching gas selectively etches an initial epitaxial semiconductor layer which is formed on insulating layers such as the gate spacer 64 and the isolation layer 53. A gas containing a halogen element that reacts with atoms in the initial epitaxial semiconductor layer is preferably employed as the initial etching gas. For example, the initial etching gas comprises a HCl gas or a $Cl_2$ gas. In addition, the initial etching gas may optionally be a diluted HCl gas which is diluted with a hydrogen gas.

When the initial semiconductor source gas and the initial etching gas are injected into the reaction chamber, the initial semiconductor source gas is decomposed by thermal energy in the reaction chamber. Source atoms decomposed from the initial semiconductor source gas are bonded to dangling bonds on the surfaces of the gate electrode 57, the source/drain regions 65, the gate spacer 64 and the isolation layer 53. In general, the bonding energy of the semiconductor atoms adsorbed on the insulating layer is smaller than that of the semiconductor atoms adsorbed on the semiconductor layer. As a result, the source atoms adsorbed on the isolation layer 53 and the gate spacer 64 can readily react with the initial etching gas so that they are selectively removed. For example, when the initial semiconductor source gas is a silicon source gas and the initial etching gas is a HCl gas, Cl atoms of the HCl gas react with silicon atoms adsorbed on the isolation layer 53 and the gate spacer 64 to generate a by-product such as $SiCl_4$, i.e., a gas compound. The gas compound is evacuated from the reaction chamber. As a result, first and second initial epitaxial semiconductor layers 66a and 66b are selectively formed on the gate electrode 57 and the source/drain regions 65, respectively.

A dopant gas may be additionally injected during injection of the initial semiconductor source gas and the initial etching gas. In particular, when a process of forming the source/drain regions 65 is omitted, the dopant gas may be injected during formation of the initial epitaxial semiconductor layers 66a and 66b. A phosphine ($PH_3$) gas, a diborane ($B_2H_6$) gas, or an arsine ($AsH_3$) gas can be employed as the dopant gas. Accordingly, the initial epitaxial semiconductor layers 66a and 66b comprise in-situ doped semiconductor layers.

The initial epitaxial semiconductor layers 66a and 66b are formed to prevent the gate electrode 57 from being over-etched due to a high etch selectivity during a subsequent epitaxial growth process and a subsequent etching process to be alternately and repeatedly performed. Thus, the process of forming the initial epitaxial semiconductor layers 66a and 66b may be omitted, in accordance to the etch selectivity of the cyclic process composed of the subsequent epitaxial growth process and the subsequent etching process.

The initial epitaxial semiconductor layers 66a and 66b are grown to have the same crystalline structure as the material layer under the initial epitaxial semiconductor layers. That is, the first initial epitaxial semiconductor layer 66a is grown to have an amorphous phase when the gate electrode 57 is formed of an amorphous silicon layer, and the first initial epitaxial semiconductor layer 66a is grown to have a polycrystalline phase when the gate electrode 57 is formed of a polycrystalline silicon layer.

In the meantime, the second initial epitaxial semiconductor layer 66b on the source/drain regions 65 are grown to have a single crystalline structure, since the source/drain regions 65 have a single crystalline structure.

After injection of the initial semiconductor source gas and the initial etching gas, a main semiconductor source gas and a main etching gas are injected into the reaction chamber (step 19 of FIG. 1B) to form first and second epitaxial semiconductor layers 67a and 67b on the first and second initial epitaxial semiconductor layers 66a and 66b respectively. The main semiconductor source gas may be the same gas as the initial semiconductor source gas, and the main etching gas may be the same gas as the initial etching gas. In other words, the growth mechanism of the first and second epitaxial semiconductor layers 67a and 67b is equal to that of the first and second initial epitaxial semiconductor layers 66a and 66b, respectively. In addition, injection time of the main semiconductor source gas and the main etching gas may be shorter than that of the initial semiconductor source gas and the initial etching gas. For example, the main semiconductor source gas and the main etching gas can be injected for about 5 seconds to about 12 seconds. As a result, the first and second thin epitaxial semiconductor layers 67a and 67b are selectively formed on the first and second initial epitaxial semiconductor layers 66a and 66b, respectively. In addition, the main semiconductor source gas and the main etching gas can also be injected along with the above-mentioned dopant gas. In the meantime, even though the gate electrode 57 is formed of an amorphous semiconductor layer, the gate electrode 57 may be transformed to a polycrystalline semiconductor layer during formation of the first and second epitaxial semiconductor layers 67a and 67b. This is because the substrate in the reaction chamber is heated to a temperature higher than about 600° C. during injection of the main semiconductor source gas and the main etching gas.

The initial semiconductor source gas and the main semiconductor source gas can be determined according to the type of semiconductor layer to be formed. For example, in order to have the initial epitaxial semiconductor layer 66a and 66b and the epitaxial semiconductor layers 67a and 67b formed of silicon layers, a silicon source gas such as a silane ($SiH_4$) gas, a disilane ($Si_2H_6$) gas, a dichlorosilane ($SiH_2Cl_2$) gas, a $SiHCl_3$ gas or a $SiCl_4$ gas can be employed as the initial semiconductor source gas and the main semiconductor source gas. In addition, in order to have the initial epitaxial semiconductor layers 66a and 66b and the epitaxial semiconductor layers 67a and 67b formed of germanium layers, a germanium source gas such as a $GeH_4$ gas can be employed as the initial semiconductor source gas and the main semiconductor source gas. Furthermore, in order to have the initial epitaxial semiconductor layers 66a and 66b and the epitaxial semiconductor layers 67a and 67b formed of SiGe layers, a mixture gas of the germanium source gas and the silicon source gas can be employed as the initial semiconductor source gas and the main semiconductor source gas. Moreover, in order to have the initial epitaxial semiconductor layers 66a and 66b and the epitaxial semiconductor layers 67a and 67b formed of carbide (SiCx) layers, a mixture gas of the silicon source gas and a carbon source gas can be used as the initial semiconductor source gas and the main semiconductor source gas. The carbon source gas may be, for example, a $C_2H_6$ gas or a $CH_3SiH_3$ gas.

The epitaxial silicon layer, the epitaxial germanium layer, the epitaxial silicon germanium layer and the epitaxial silicon carbide layer can be formed using the epitaxial process conditions described in the following tables 1 to 4 respectively.

TABLE 1

| | |
|---|---|
| Process temperature | 700° C.~900° C. |
| Process pressure | 10 torr~20 torr |
| Silicon source gas | $SiH_2Cl_2$ gas (100 sccm~200 sccm) |
| Main etching gas | HCl gas (1 sccm~100 sccm) |
| P-type dopant gas | $B_2H_6$ gas (0 sccm~100 sccm) |
| N-type dopant gas | $PH_3$ gas (0 sccm~100 sccm) |
| Carrier gas | $H_2$ gas (10,000 sccm~35,000 sccm) |

TABLE 2

| | |
|---|---|
| Process temperature | 700° C.~900° C. |
| Process pressure | 10 torr~20 torr |
| Germanium source gas | $GeH_4$ gas (50 sccm~200 sccm) |
| Main etching gas | HCl gas (1 sccm~100 sccm) |
| P-type dopant gas | $B_2H_6$ gas (0 sccm~100 sccm) |
| N-type dopant gas | $PH_3$ gas (0 sccm~100 sccm) |
| Carrier gas | $H_2$ gas (10,000 sccm~35,000 sccm) |

TABLE 3

| | |
|---|---|
| Process temperature | 500° C.~750° C. |
| Process pressure | 10 torr~20 torr |
| Silicon source gas | $SiH_2Cl_2$ gas (100 sccm~200 sccm) |
| Germanium source gas | $GeH_4$ gas (50 sccm~200 sccm) |
| Main etching gas | HCl gas (1 sccm~100 sccm) |
| P-type dopant gas | $B_2H_6$ gas (0 sccm~100 sccm) |
| N-type dopant gas | $PH_3$ gas (0 sccm~100 sccm) |
| Carrier gas | $H_2$ gas (10,000 sccm~35,000 sccm) |

TABLE 4

| | |
|---|---|
| Process temperature | 650° C.~850° C. |
| Process pressure | 10 torr~20 torr |
| Silicon source gas | $SiH_2Cl_2$ gas (100 sccm~200 sccm) |
| Carbon source gas | $CH_3SiH_3$ gas (5 sccm~50 sccm) |
| Main etching gas | HCl gas (1 sccm~100 sccm) |
| P-type dopant gas | $B_2H_6$ gas (0 sccm~100 sccm) |
| N-type dopant gas | $PH_3$ gas (0 sccm~100 sccm) |
| Carrier gas | $H_2$ gas (10,000 sccm~35,000 sccm) |

After the main semiconductor source gas and the main etching gas are injected, a first purge gas can be injected into the reaction chamber (step 21 of FIG. 1B). The first purge gas may comprise, for example, a hydrogen gas. The first purge gas, i.e., the hydrogen gas, not only exhausts process gases remaining in the reaction chamber but also removes the native oxide layer and/or contaminants on the surfaces of the first and second epitaxial semiconductor layers 67a and 67b.

After the first purge gas is injected, a selective etching gas is injected into the reaction chamber to remove the first epitaxial semiconductor layer 67a (step 23 of FIG. 1B). The selective etching gas preferably contains a halogen element which reacts with atoms of the epitaxial semiconductor layers 67a and 67b. For example, the selective etching gas may be a HCl gas or a $Cl_2$ gas. In addition, the selective etching gas may be a diluted HCl gas which is diluted with a hydrogen gas. The selective etching process can be carried out, for example, using the process conditions described in the following table 5.

TABLE 5

| Process temperature | 600° C.~800° C. |
|---|---|
| Process pressure | 5 torr~760 torr |
| Selective etching gas | HCl gas (10 sccm~15,000 sccm) |
| Carrier gas | $H_2$ gas (500 sccm~35,000 sccm) |

Chloric atoms of the selective etching gas react with silicon atoms of the epitaxial semiconductor layers 67a and 67b to generate a $SiCl_4$ gas. In particular, when the selective etching process is carried out, an etch rate of the first epitaxial semiconductor layer 67a is higher than that of the second epitaxial semiconductor layer 67b. This is because the first epitaxial semiconductor layer 67a is a polycrystalline semiconductor layer and the second epitaxial semiconductor layer 67b is a single crystalline semiconductor layer. Such an etch selectivity will be described in detail below with reference to FIG. 4.

Figure 4:
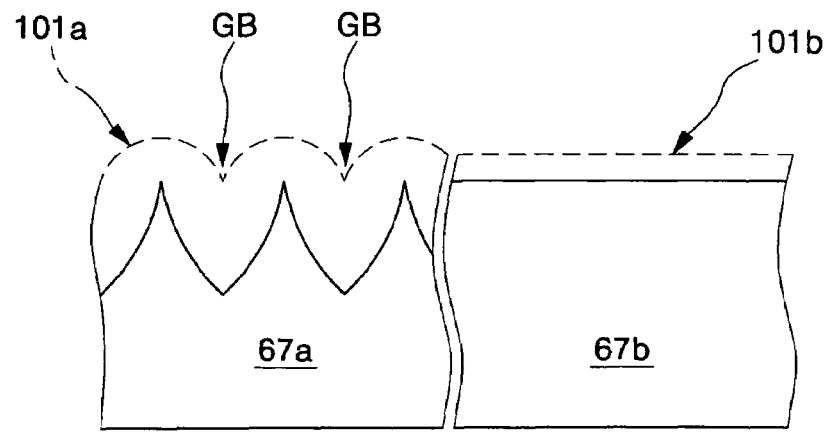

Referring to FIG. 4, the first epitaxial semiconductor layer 67a has an uneven surface 101a whereas the second epitaxial semiconductor layer 67b has a flat surface 101b. The uneven surface 101a is a result of grains of the first epitaxial semiconductor layer 67a. When the selective etching gas is supplied to surfaces of the first and second epitaxial semiconductor layers 67a and 67b, silicon atoms of grain boundary regions GB of the first epitaxial semiconductor layer 67a readily react with the chloric atoms of the selective etching gas. As a result, the grain boundary regions GB are recessed and the grains are also laterally etched. On the contrary, the reaction rate of the second epitaxial semiconductor layer 67b and the selective etching gas may be relatively slow since the second epitaxial semiconductor layer 67b is a single crystalline semiconductor layer having a flat surface. As a result, the etch rate of the first epitaxial semiconductor layer 67a is higher than that of the second epitaxial semiconductor layer 67b.

When the selective etching process is carried out under appropriate conditions as mentioned above, a portion of the second epitaxial semiconductor layer 67b may still remain even though the first epitaxial semiconductor layer 67a is completely removed and the first initial epitaxial semiconductor layer 66a is etched.

A second purge gas is injected into the reaction chamber after the selective etching process is carried out (step 25 of FIG. 1B). The second purge gas may optionally be the same gas as the first purge gas.

Figure 5:
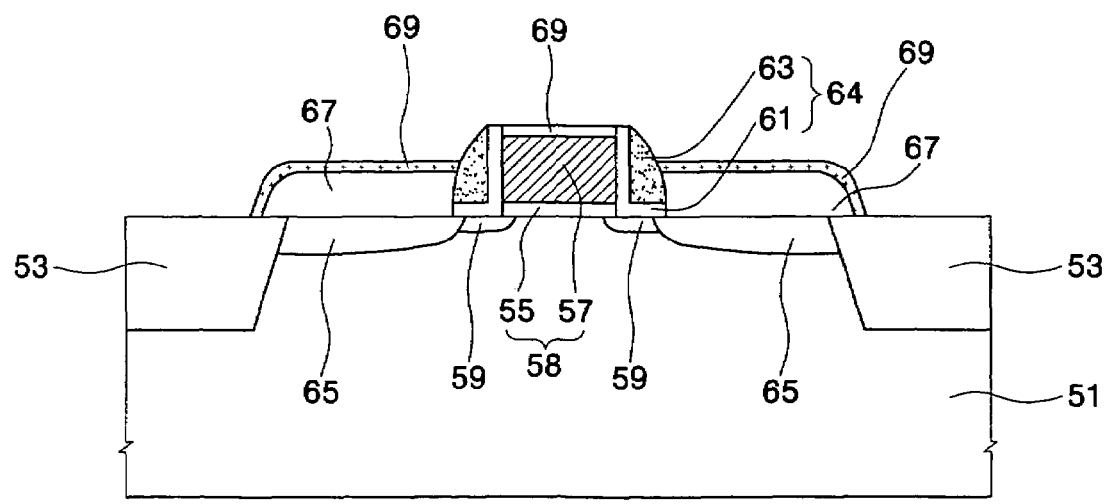

Referring to FIGS. 1B and 5, the value of "N" is incremented by 1 after injection of the first purge gas (step 27 of FIG. 1B). The incremented value of "N" is then compared with the value of "K" (step 29 of FIG. 1B). The process of injecting the main gases, the first purge process, the selective etching process and the second purge process may be sequentially and repeatedly carried out until the value of "N" is equal to the value of "K", thereby forming elevated single crystalline epitaxial semiconductor layers 67 having a desired thickness, i.e., elevated single crystalline source/drain regions 67 on the single crystalline source/drain regions 65, while at the same time exposing the gate electrode 57. In the event that the process of forming the source/drain regions 65 is omitted, the elevated single crystalline source/drain regions 67 may be formed of an in-situ doped epitaxial semiconductor layer. In this case, impurities in the in-situ doped epitaxial semiconductor layer are diffused during a subsequent thermal process to form impurity regions that correspond to the source/drain regions 67. A metal silicide layer 69 can optionally be formed on the gate electrode 57 and the elevated single crystalline source/drain regions 67 using a conventional self-aligned silicide (salicide) technique.

In accordance with embodiments of the present invention as mentioned above, an elevated single crystalline epitaxial semiconductor layer is selectively formed on a single crystalline semiconductor. Also, formation of the epitaxial semiconductor layer on non-single crystalline semiconductor regions of the device, for example on the surfaces of the gate electrode 57, the gate spacer 64, and the isolation layer 53 is suppressed.

FIGS. 6 to 11 are cross-sectional views to illustrate methods of fabricating a MOS transistor having a strained channel using a formation method of a selective epitaxial semiconductor layer in accordance with exemplary embodiments of the present invention.

Figure 6:
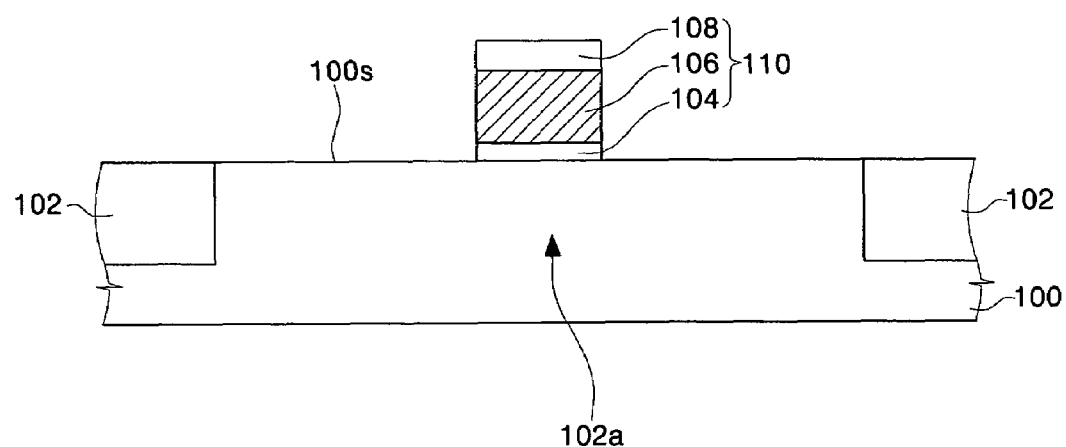
FIGS. 6 to 11 are cross-sectional views to illustrate methods of fabricating a MOS transistor having a strained channel using a selective epitaxial growth technique in accordance with embodiments of the present invention.

Referring to FIG. 6, a semiconductor substrate 100 is provided. The semiconductor substrate 100 comprises, for example, a single crystalline silicon substrate, a single crystalline germanium substrate, a single crystalline silicon germanium substrate, a single crystalline silicon carbide substrate, or an SOI (silicon on insulator) substrate having any one layer thereof. An isolation layer 102 is formed in a predetermined region of the semiconductor substrate 100 to define an active region 102a. The isolation layer 102 may be formed using a typical trench isolation technique. A gate insulating layer 104 is formed on a main surface 100s of the substrate having the isolation layer 102, and a gate conductive layer and a capping insulating layer are sequentially formed on the substrate having the gate insulating layer 104. The gate conductive layer may be formed of a polysilicon layer, and the capping insulating layer may be formed of a silicon nitride layer. The capping insulating layer and the gate conductive layer are patterned to form a gate pattern 110 which lies over the active region 102a. In this case, the gate insulating layer 104 may also be etched to expose the upper surface 100s of the semiconductor substrate adjacent to the gate pattern 110, i.e., an upper surface of the active region 102a. Thus, the gate pattern 110 may comprise the gate insulating layer 104, a gate electrode 106, and a capping layer pattern 108 which are sequentially stacked.

Figure 7:
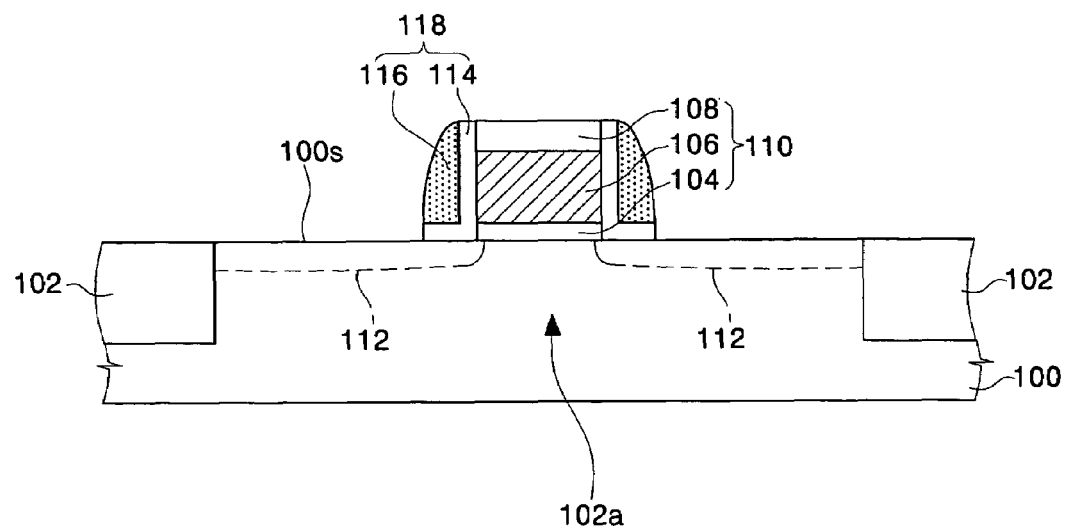

Referring to FIG. 7, impurity ions are implanted into the active region 102a using the gate pattern 110 as an ion implantation mask, thereby forming low concentration impurity regions 112. The low concentration impurity regions 112 are formed by implanting impurity ions having a conductivity type that is opposite to that of the semiconductor substrate 100. For example, when the semiconductor substrate 100 is a P-type silicon substrate, the low concentration impurity regions 112 may be formed by implanting N-type impurity ions. An insulating spacer layer, i.e., a gate spacer layer, is formed on an entire surface of the substrate having the low concentration impurity regions 112. The insulating spacer layer may be formed by sequentially stacking a silicon oxide layer and a silicon nitride layer. The insulating spacer layer is anisotropically etched to form an insulating spacer 118 on a sidewall of the gate pattern 110. Consequently, the insulating spacer 118 may be formed to have an inner oxide spacer 114 and an outer nitride spacer 116.

Figure 8:
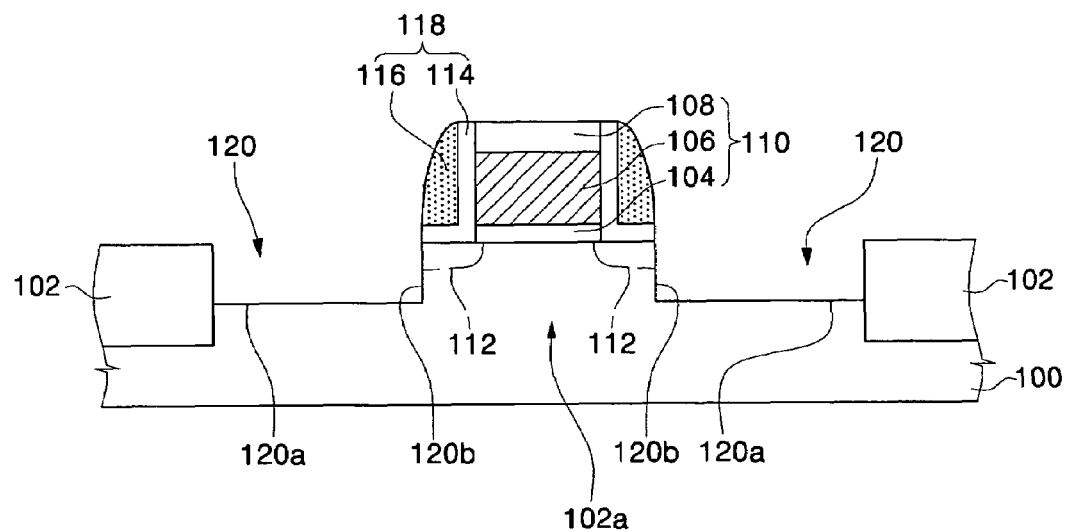

Referring to FIG. 8, the semiconductor substrate 100 is anisotropically etched using the gate pattern 110, the insulating spacer 118 and the isolation layer 102 as etch masks to form recesses 120 having a predetermined depth from the main surface 100s of the semiconductor substrate 100. As shown in FIG. 8, the recesses 120 may be self-aligned to the insulating spacer 118 and the isolation layer 102. In addition, the recesses 120 may have bottom surfaces 120a and sidewalls 120b. The sidewalls 120b may be self-aligned with the insulating spacer 118.

Figure 9:
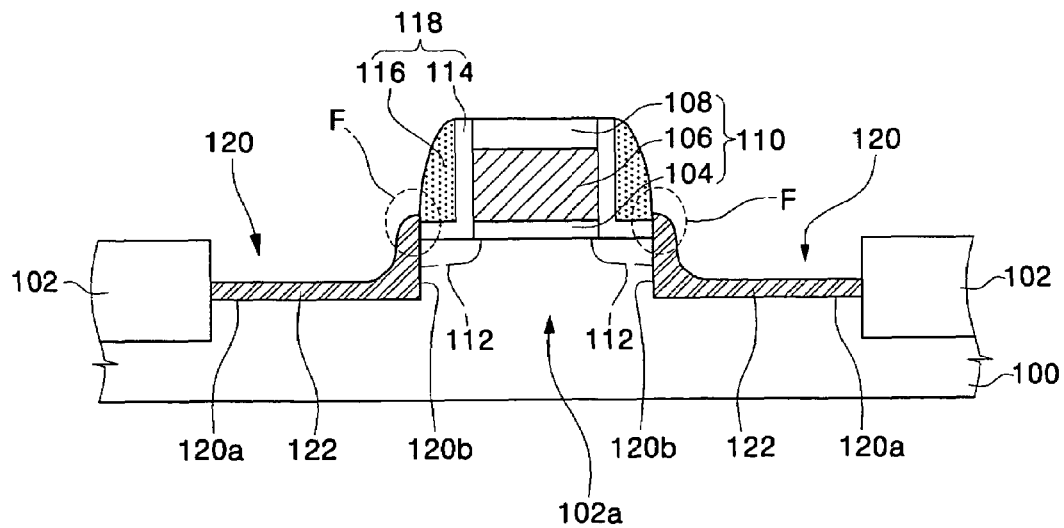

Referring to FIG. 9, epitaxial semiconductor layers 122 are selectively formed in the recesses 120 using the same methods as the processing steps 5, 7, 9, 11, 13, 15, 17 and 19 shown above in FIGS. 1A and 1B. The epitaxial semiconductor layers 122 may be formed of a semiconductor material having a different lattice constant from that of the semiconductor substrate 100. For example, when the semiconductor substrate region 100 between the low concentration impurity regions 112 is a P-type silicon substrate operating as a channel region of an NMOS transistor, the epitaxial semiconductor layers 122 may be formed of a semiconductor material having a lattice constant that is less than that of a lattice constant of the silicon substrate, e.g., a silicon carbide layer (SiC). In this case, tensile stress is applied to the silicon substrate between the low concentration impurity regions 112, thereby increasing the mobility of electrons that operate as carriers of the NMOS transistor. On the contrary, when the portion of the semiconductor substrate 100 between the low concentration impurity regions 112 is an N-type silicon substrate operating as a channel region of a PMOS transistor, the epitaxial semiconductor layers 122 may be formed of a semiconductor material having a lattice constant that is greater than that of a lattice constant of the silicon substrate, e.g., a silicon germanium (SiGe) layer or a germanium (Ge) layer. In this case, compressive stress is applied to the silicon substrate between the low concentration impurity regions 112, thereby increasing the mobility of holes that operate as carriers of the PMOS transistor.

The epitaxial semiconductor layers 122 may be excessively grown to cover lower regions of the insulating spacers 118, which are adjacent to the recesses 120. Consequently, the epitaxial semiconductor layers 122 may be formed to have fence regions, or fences F, covering the lower regions of the insulating spacers 118, as shown in FIG. 9. This is because the portions of the epitaxial semiconductor layers 122 adjacent to the isolation layer 102 are grown only upward from the bottom surfaces 120a, whereas the epitaxial semiconductor layers 122 adjacent to the insulating spacers 118 are simultaneously grown vertically and laterally from the sidewalls 120b as well as the bottom surfaces 120a. That is, the fences F are formed due to lateral growth from the sidewalls 120b. The fences F may cause an abnormal impurity profile of source/drain regions to be formed in a subsequent ion implantation process, which, in turn, can degrade the electrical characteristics of the MOS transistor.

After formation of the epitaxial semiconductor layers 122, a first purge gas may be injected into the reaction chamber (step 21 in FIG. 1B). The first purge gas comprises for example, a hydrogen gas. The first purge gas, i.e., the hydrogen gas, purges process gases remaining in the reaction chamber and removes native oxide layers and contaminants from surfaces of the epitaxial semiconductor layers 122.

Figure 10:
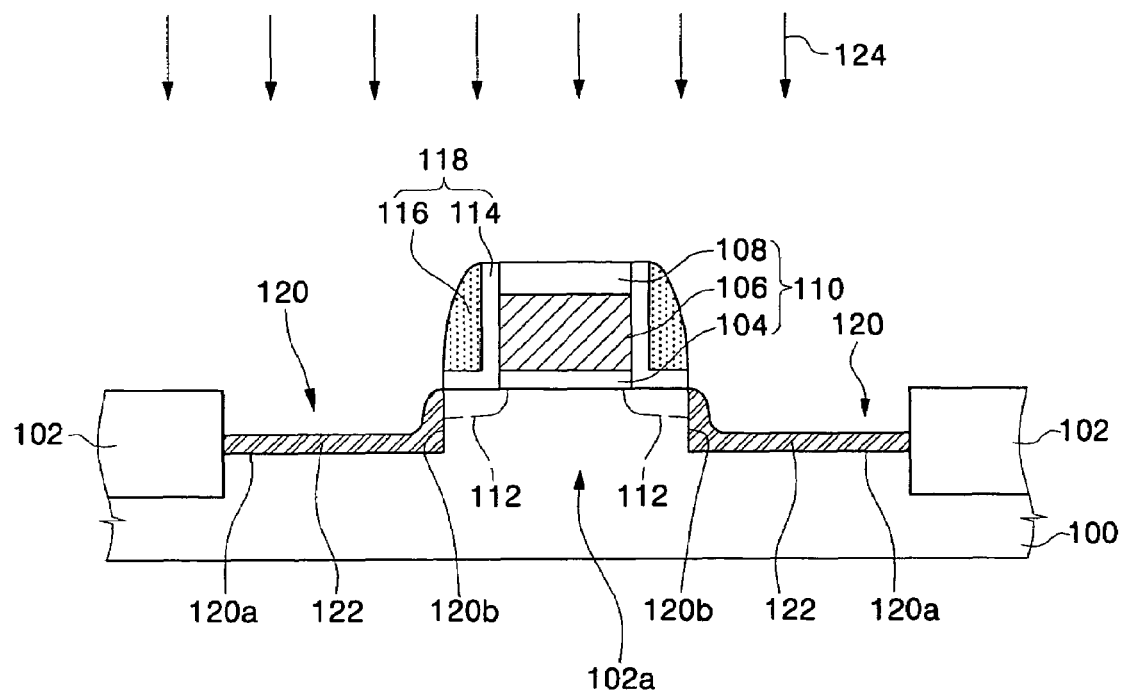

Referring to FIG. 10, after injection of the first purge gas, a selective etching gas 124 is injected into the reaction chamber to selectively etch the fences F of the epitaxial semiconductor layers 122 (step 23 in FIG. 1B). Consequently, entire outer walls of the insulating spacers 118 may become exposed. The selective etching gas 124 can be the same gas as the selective etching gas described with reference to FIGS. 3 and 4. That is, the selective etching gas 124 may be a hydrogen chloride (HCl) gas, a chlorine ($Cl_2$) gas, or a sulfur hexafluoride ($SF_6$) gas. In addition, the selective etching gas 124 may further contain a dilute gas such as a hydrogen ($H_2$) gas, an argon (Ar) gas, a nitrogen ($N_2$) gas, an oxygen ($O_2$) gas or a helium (He) gas. In one embodiment, the selective etching gas 124 is injected into the reaction chamber for about 5 seconds to about 100 seconds. When the upper surface 100s of the semiconductor substrate 100 has a (100) plane orientation, the epitaxial semiconductor layers 122 growing from the bottom surfaces 120a may be grown to have the (100) plane orientation whereas the epitaxial semiconductor layers 122 growing laterally from the sidewalls 120b, i.e., the fences F may be grown to have a (111) plane orientation or a (311) plane orientation. An etch rate of the fences F having the (111) plane orientation or the (311) plane orientation is higher than an etch rate of the epitaxial semiconductor layers 122 having the (100) plane orientation. As a result, the fences F may be selectively removed during injection of the selective etching gas 124, as shown in FIG. 10. The epitaxial semiconductor layers 122 having the (100) plane orientation may also be etched during injection of the selective etching gas 124. Accordingly, the epitaxial semiconductor layers 122 remaining in the recesses 120 after injection of the selective etching gas 124 may be relatively reduced in thickness, as compared to the thickness of the initial epitaxial semiconductor layers.

After injection of the selective etching gas 124, a second purge gas can be injected into the reaction chamber (step 25 in FIG. 1B). In one embodiment, the second purge gas is the same gas as the first purge gas.

Figure 11:
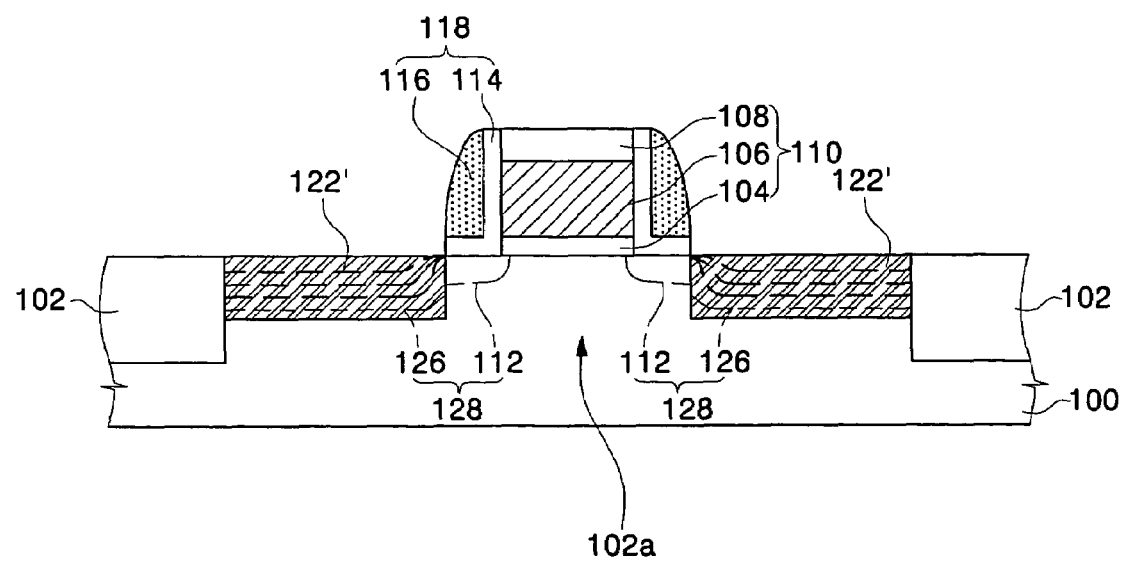

Referring to FIG. 11, after injection of the second purge gas, the injection process of the main source gas and the main-etching gas (step 19), the first purge process (step 21), the injection process of the selective etching gas (step 23), and the second purge process (step 25) are sequentially and repeatedly performed to form final epitaxial semiconductor layers 122' having a desired thickness in the recesses 120, as shown in FIG. 1B. As described above, the insulating spacers 118 may be continuously exposed while the processes are repeatedly carried out, and the final epitaxial semiconductor layers 122' can be formed to fill the recesses 120 only. Accordingly, the final epitaxial semiconductor layers 122' may be formed to have a flat top surface as shown in FIG. 11. Further, if the cycle number of the injection process of the main source gas and the main etching gas (step 19), the first purge process (step 21), the injection process of the selective etching gas (step 23), and the second purge process (step 25) is increased, the final epitaxial semiconductor layers 122' can be made thicker so as to be elevated from the main surface 100s of the semiconductor substrate. In this case, the final epitaxial semiconductor layers 122' may constitute an elevated source/drain structure.

After formation of the final epitaxial semiconductor layers 122', impurity ions can be implanted into the final epitaxial semiconductor layers 122' using the gate pattern 110, the insulating spacer 118 and the isolation layer 102 as ion implantation masks to form source/drain regions 126. The source/drain regions 126 are formed by injecting impurity ions having the same conductivity type as the low concentration impurity regions 112. In addition, the source/drain regions 126 may be formed to have an impurity concentration higher than the low concentration impurity regions 112. Consequently, LDD-type source/drain regions 128 may be formed at both sides of the gate pattern 110. Alternatively, a dopant gas may be additionally injected during injection of the main source gas and the main etching process. In this case, the ion implantation process of FIG. 11 for forming the source/drain regions 126 may be skipped.

In the present invention, a sidewall of an insulating layer, which is adjacent to the recess and is provided on the semiconductor substrate, is prevented from being covered by an overgrown epitaxial semiconductor layer while an epitaxial semiconductor layer can be selectively formed to fill the recess in the semiconductor substrate. Accordingly, the epitaxial semiconductor layer having a flat top surface can be selectively formed to fill the recess.

While this invention has been particularly shown and described with references to preferred embodiments thereof, it will be understood by those skilled in the art that various changes in form and details may be made herein without departing from the spirit and scope of the invention as defined by the appended claims.

What is claimed is:

1. A method of fabricating a semiconductor device, comprising:
   forming a recess in a semiconductor substrate;
   loading the substrate having the recess into a reaction chamber;
   injecting a semiconductor source gas and a main etching gas into the reaction chamber to selectively grow an epitaxial semiconductor layer on a sidewall and on a bottom surface of the recess; and
   injecting a selective etching gas into the reaction chamber to selectively etch a fence of the epitaxial semiconductor layer adjacent to the sidewall of the recess and grown to a level that is higher than an upper surface of the semiconductor substrate.

2. The method according to claim 1, further comprising:
   alternately and repeatedly performing the injection of the semiconductor source gas and the main etching gas and the injection of the selective etching gas at least once, thereby forming a final epitaxial semiconductor layer that fills the recess and has a substantially flat top surface.

3. The method according to claim 1, wherein the semiconductor substrate is a single crystalline silicon substrate, a single crystalline germanium substrate, a single crystalline silicon germanium substrate, a single crystalline silicon carbide substrate, or a silicon-on-insulator (SOI) substrate having any one layer thereof.

4. The method according to claim 1, wherein forming the recess includes selectively anisotropically etching a predetermined region of the semiconductor substrate.

5. The method according to claim 1, wherein the semiconductor source gas is a silicon source gas, a germanium source gas, a silicon germanium source gas, or a silicon carbide source gas.

6. The method according to claim 1, wherein the main etching gas and the selective etching gas are gases containing halogen elements reacting with atoms of the epitaxial semiconductor layer.

7. The method according to claim 6, wherein each of the main etching gas and the selective etching gas is a hydrogen chloride (HCl) gas, a chlorine ($Cl_2$) gas or a sulfur hexafluoride ($SF_6$) gas.

8. The method according to claim 7, wherein each of the main etching gas and the selective etching gas further contains at least one of a hydrogen ($H_2$) gas, an argon (Ar) gas, a nitrogen ($N_2$) gas, an oxygen ($O_2$) gas or a helium (He) gas.

9. The method according to claim 1, further comprising:
   injecting a first purge gas into the reaction chamber prior to injection of the selective etching gas; and
   injecting a second purge gas into the reaction chamber after injection of the selective etching gas.

10. The method according to claim 9, wherein the first and second purge gases are hydrogen gases.

11. The method according to claim 1, wherein the epitaxial semiconductor layer is formed of a semiconductor material having a lattice constant that is different than a lattice constant of the semiconductor substrate.

12. A method of fabricating a metal oxide semiconductor (MOS) transistor, comprising:
   forming a gate pattern on a semiconductor substrate;
   forming an insulating spacer on sidewalls of the gate pattern;
   forming recesses in the semiconductor substrate at both sides of the gate pattern;
   loading the substrate having the recesses into a reaction chamber;
   injecting a semiconductor source gas and a main etching gas into the reaction chamber to selectively grow epitaxial semiconductor layers on sidewalls and on bottom surfaces of the recesses; and
   injecting a selective etching gas into the reaction chamber to selectively etch fences of the epitaxial semiconductor layer adjacent to the sidewalls of the recesses and grown to a level that is higher than an upper surface of the semiconductor substrate.

13. The method according to claim 12, further comprising:
   alternately and repeatedly performing the injection of the semiconductor source gas and the main etching gas and the injection of the selective etching gas at least once to form final epitaxial semiconductor layers that fill the recesses and have substantially flat top surfaces.

14. The method according to claim 13, wherein the final epitaxial semiconductor layers are formed to fill the recesses and have top surfaces that are higher than the upper surface of the semiconductor substrate.

15. The method according to claim 13, further comprising:
   after formation of the final epitaxial semiconductor layers, implanting impurity ions into the final epitaxial semiconductor layers using the gate pattern and the insulating spacer as ion implantation masks to form source/drain regions.

16. The method according to claim 12, wherein the fences of the epitaxial semiconductor layers are grown to cover a lower side portion of the insulating spacer.

17. The method according to claim 12, wherein the semiconductor substrate is a single crystalline silicon substrate, a single crystalline germanium substrate, a single crystalline silicon germanium substrate, a single crystalline silicon carbide substrate, or a silicon-on-insulator (SOI) substrate having any one layer thereof.

18. The method according to claim 12, wherein forming the recesses includes anisotropically etching the semiconductor substrate using the gate pattern and the insulating spacers as etch masks.

19. The method according to claim 12, wherein the semiconductor source gas is a silicon source gas, a germanium source gas, a silicon germanium source gas, or a silicon carbide source gas.

20. The method according to claim 12, wherein the main etching gas and the selective etching gas are gases containing halogen elements reacting with atoms of the epitaxial semiconductor layer.

21. The method according to claim 20, wherein each of the main etching gas and the selective etching gas is a hydrogen chloride (HCl) gas, a chlorine ($Cl_2$) gas or a sulfur hexafluoride ($SF_6$) gas.

22. The method according to claim 21, wherein each of the main etching gas and the selective etching gas further contains at least one of a hydrogen ($H_2$) gas, an argon (Ar) gas, a nitrogen ($N_2$) gas, an oxygen ($O_2$) gas or a helium (He) gas.

23. The method according to claim 12, wherein the semiconductor source gas and the main etching gas are injected along with a dopant gas.

24. The method according to claim 12, further comprising:
    injecting a first purge gas into the reaction chamber prior to injection of the selective etching gas; and
    injecting a second purge gas into the reaction chamber after injection of the selective etching gas.

25. The method according to claim 24, wherein the first and second purge gases are hydrogen gases.

26. The method according to claim 12, wherein the epitaxial semiconductor layer is formed of a semiconductor material having a lattice constant different than that of a lattice constant of the semiconductor substrate.

* * * * *